(12) United States Patent
Hautala et al.

(10) Patent No.: US 8,592,784 B2
(45) Date of Patent: Nov. 26, 2013

(54) METHOD FOR MODIFYING A MATERIAL LAYER USING GAS CLUSTER ION BEAM PROCESSING

(75) Inventors: John J. Hautala, Beverly, MA (US); Nathan E. Baxter, Arlington, MA (US)

(73) Assignee: TEL Epion Inc., Billerica, MA (US)

( * ) Notice: Subject to any disclaimer, the term of this patent is extended or adjusted under 35 U.S.C. 154(b) by 228 days.

(21) Appl. No.: 13/181,910

(22) Filed: Jul. 13, 2011

(65) Prior Publication Data

US 2011/0266466 A1 Nov. 3, 2011

Related U.S. Application Data

(63) Continuation of application No. 12/415,755, filed on Mar. 31, 2009, now Pat. No. 7,982,196.

(51) Int. Cl.
*H01J 37/317* (2006.01)

(52) U.S. Cl.
CPC .................................. *H01J 37/317* (2013.01)
USPC ................... 250/492.21; 250/492.2

(58) Field of Classification Search
USPC ............... 250/492.21, 492.2, 492.3
See application file for complete search history.

(56) References Cited

U.S. PATENT DOCUMENTS

| 4,361,762 | A | 11/1982 | Douglas |
| 4,886,971 | A | 12/1989 | Matsumura et al. |
| 4,916,311 | A | 4/1990 | Fuzishita et al. |
| 5,459,326 | A | 10/1995 | Yamada |
| 5,612,254 | A | 3/1997 | Mu et al. |
| 5,907,780 | A | 5/1999 | Gilmer et al. |
| 5,990,493 | A * | 11/1999 | Gardner et al. ............ 257/77 |
| 6,124,620 | A * | 9/2000 | Gardner et al. ............ 257/411 |
| 6,218,207 | B1 | 4/2001 | Itoh et al. |
| 6,416,820 | B1 | 7/2002 | Yamada et al. |
| 6,498,107 | B1 | 12/2002 | Fenner |
| 6,797,339 | B2 | 9/2004 | Akizuki et al. |
| 7,060,989 | B2 | 6/2006 | Swenson et al. |
| 7,173,252 | B2 | 2/2007 | Mack |
| 7,491,953 | B2 * | 2/2009 | Horsky et al. ............ 250/492.21 |
| 7,960,709 | B2 * | 6/2011 | Horsky et al. ............ 250/492.21 |
| 2002/0130275 | A1 | 9/2002 | Mack et al. |
| 2003/0026990 | A1 | 2/2003 | Yamada et al. |

(Continued)

FOREIGN PATENT DOCUMENTS

| EP | 1918963 | A2 | 5/2008 |
| JP | 62296357 | A | 12/1987 |
| JP | 06275545 | | 9/1994 |
| WO | 0026431 | A1 | 5/2000 |

OTHER PUBLICATIONS

U.S. Patent and Trademark Office, Non-final Office Action issued in related U.S. Appl. No. 12/415,867 dated Aug. 11, 2011, 28 pp.

(Continued)

*Primary Examiner* — Kiet T Nguyen

(74) *Attorney, Agent, or Firm* — Wood, Herron & Evans, LLP

(57) ABSTRACT

A method of modifying a material layer on a substrate is described. The method comprises forming the material layer on the substrate. Thereafter, the method comprises establishing a gas cluster ion beam (GCIB) having an energy per atom ratio ranging from about 0.25 eV per atom to about 100 eV per atom, and modifying the material layer by exposing the material layer to the GCIB.

19 Claims, 6 Drawing Sheets

(56) References Cited

U.S. PATENT DOCUMENTS

| | | |
|---|---|---|
| 2004/0137158 A1 | 7/2004 | Kools et al. |
| 2006/0124934 A1 | 6/2006 | Fukumiya et al. |
| 2007/0210366 A1 | 9/2007 | Sandhu et al. |
| 2008/0149826 A1 | 6/2008 | Renau et al. |
| 2008/0299749 A1 | 12/2008 | Jacobson et al. |
| 2009/0071818 A1 | 3/2009 | Fukumiya et al. |
| 2009/0087969 A1 | 4/2009 | Russell et al. |
| 2009/0152629 A1 | 6/2009 | Hu et al. |
| 2010/0227142 A1 | 9/2010 | Hautala et al. |

OTHER PUBLICATIONS

Taiwan Intellectual Property Office, Office Action issued in corresponding Taiwan Patent Application No. 099109971 dated Jan. 10, 2013, 7 pp. including translation.

Hautala J., et al. Infusion Processing: An Alternative to Plasma Technology for Semiconductor Device Manufacturing, Proceedings of the Electrochemical Society, Symposium on ULSI Process Integration IV (Quebec PR, Canada, May 16-20, 2005), 2005, vol. 6, pp. 118-130.

Shao et al. Nitrogen gas-cluster ion beam—A new nitrogen source for GaN growth, Mat. Res. Soc. Symp. Proc., 2003, vol. 743, pp. 97-102.

Park et al., Evolution of Residual Stress in Plasma-enhanced Chemical-Vapor-Deposited Silicon Dioxide Film Exposed to Room Air, Applied Physics Letters, Dec. 13, 1999, pp. 3811-3813, vol. 75, No. 24.

Nguyen, S. V., High-density Plasma Chemical Vapor Deposition of Silicon-based Dielectric Films for Integrated Circuits, J. Res. Develop., Jan./Mar. 1999, pp. 109-126, vol. 43, No. 1/2.

Witvrouw et al., A Comparison Between Wet HF Etching and Vapor HF Etching for Sacrificial Oxide Removal, SPIE vol. 4174 (2000), pp. 130-141.

Isao Yamada et al., Materials Processing by Gas Cluster Ion Beams, Materials Science and Engineering Reports, vol. 34, Issue 6, pp. 231-295, Oct. 30, 2001 (ISSN: 09S7-796X).

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

U.S. Patent and Trademark Office, Final Office Action issued in related U.S. Appl. No. 12/415,867, Jan. 10, 2012, 15 pp.

\* cited by examiner

METHOD FOR MODIFYING A MATERIAL LAYER USING GAS CLUSTER ION BEAM PROCESSING

CROSS-REFERENCE TO RELATED APPLICATIONS

This application is a continuation of U.S. patent application Ser. No. 12/415,755 filed Mar. 31, 2009, now U.S. Pat. No. 7,982,196 issued Jul. 19, 2011, and entitled METHOD FOR MODIFYING A MATERIAL LAYER USING GAS CLUSTER ION BEAM PROCESSING, the disclosure of which is incorporated herein by reference in its entirety as if completely set forth herein below. This application is also related to co-pending U.S. application Ser. No. 12/415,867 filed Mar. 31, 2009 and entitled METHOD FOR ENHANCING A SUBSTRATE USING GAS CLUSTER ION BEAM PROCESSING (Ref. EP-170), the disclosure of which is herein incorporated by reference in its entirety.

BACKGROUND OF THE INVENTION

1. Field of Invention

The invention relates to a method for modifying a material layer using a gas cluster ion beam (GCIB).

2. Description of Related Art

Gas cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electron charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, and nitrous oxide, and mixtures of these gases.

Several emerging applications for GCIB processing of substrates on an industrial scale are in the semiconductor field. Although GCIB processing of a substrate is performed in a wide variety of processes, many processes fail to provide adequate control of the material properties of the surface, structure, and/or film subject to GCIB treatment.

SUMMARY OF THE INVENTION

The invention relates to a method for modifying a material layer using a gas cluster ion beam (GCIB). The invention further relates to a method of adjusting a concentration of a specie present in a material layer using a GCIB. The adjustment of the concentration of the specie present in the material layer may include increasing or decreasing the concentration of the specie present in the material layer.

According to one embodiment, a method of modifying a material layer on a substrate is described. The method comprises forming the material layer on the substrate. Thereafter, the method comprises establishing a GCIB having an energy per atom ratio ranging from about 0.25 eV per atom to about 100 eV per atom, and modifying an initial concentration of a specie present in the material layer to a final concentration by exposing the material layer to the GCIB.

DETAILED DESCRIPTION OF SEVERAL EMBODIMENTS

Figure 1:
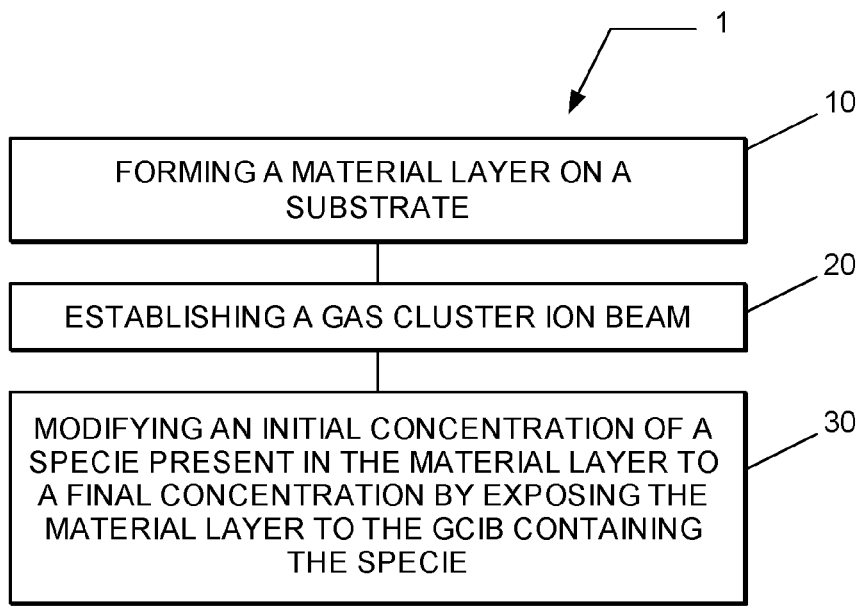
FIG. 1 is a flow chart illustrating a method for modifying a material layer using a GCIB according to an embodiment.

A method and system for modifying a material layer on a substrate using a gas cluster ion beam (GCIB) are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

As described above, there is a general need for modifying material layers or structures on a surface of a substrate using a GCIB. In particular, there is a need to modify material layers on a substrate, while providing adequate control of material properties and/or dimensions of the surface, structure, and/or film subject to GCIB treatment. For example, a material layer having either a deficiency or surplus of a specific specie not present or already present in the material layer may be subjected to GCIB treatment containing the specie in order to adjust, i.e., increase or decrease, a concentration of the specie in the material layer. Additionally, a material layer may be subjected to GCIB treatment to facilitate modification of an optical, a thermal, a chemical, and/or an electrical property of the thin film, such as a refractive index, a thermal conductivity, a thermal stability, a dielectric constant, a work function, a chemical resistance to, for example, various etch chemistries, etc.

Referring now to the drawings wherein like reference numerals designate corresponding parts throughout the several views, a method of modifying a material layer on a substrate is illustrated in FIG. 1 according to one embodiment. The method includes a flow chart 1 beginning in 10 with forming a material layer on the substrate. The material layer may be formed using any conventional technique including, but not limited to, thin film spin-on techniques and thin film vapor deposition techniques.

The material layer may comprise a conductive, non-conductive, or semi-conductive material. The material layer may comprise silicon, or a metal, or both. The material layer may comprise an oxide, wherein the specie present in the material layer comprises oxygen. For example, the oxide may comprise silicon oxide ($SiO_x$), a silicon oxynitride ($SiO_xN_y$), a metal silicate ($MSiO_x$), a metal silicon oxynitride ($MSiO_xN_y$), or a metal oxide ($MO_x$). The material layer may comprise a nitride, wherein the specie present in the material layer comprises nitrogen. For example, the nitride may comprise silicon nitride ($SiN_y$), silicon oxynitride ($SiO_xN_y$), boron nitride ($BN_y$), a metal silicon oxynitride ($MSiO_xN_y$), a metal silicon nitride ($MSiN_y$), or a metal nitride ($MN_y$). The material layer may comprise a carbide, wherein the specie present in the material layer comprises carbon. For example, the carbide may comprise silicon carbide ($SiC_y$), silicon oxycarbide ($SiO_xC_y$), silicon carbonitride ($SiC_xN_y$), silicon oxycarbonitride ($SiO_xC_yN_z$), a metal carbide ($MC_y$), a metal carbonitride ($MC_xN_y$), or a metal oxycarbonitride ($MO_xC_yN_z$). Additionally, the material layer may comprise $HfO_2$, $HfSi_xO_y$, $ZrO_2$, $ZrSi_xO_y$, $TiO_2$, $Ta_2O_5$, a rare earth oxide, mixed rare earth oxide, rare earth nitride, mixed rare earth nitride, rare earth oxynitride, mixed rare earth oxynitride, aluminum oxide, aluminum nitride, rare earth aluminum oxide, mixed rare earth aluminum oxide, rare earth aluminum nitride, mixed rare earth aluminum nitride, rare earth aluminum oxynitride, or mixed rare earth aluminum oxynitride.

Thereafter, in 20, a GCIB is established having an energy per atom ratio ranging from about 0.25 eV per atom to about 100 eV per atom. Alternatively, the GCIB is established having an energy per atom ratio ranging from about 0.25 eV per atom to about 10 eV per atom. Alternatively, the GCIB is established having an energy per atom ratio ranging from about 1 eV per atom to about 10 eV per atom. The GCIB can be formed in a GCIB processing system, such as any of the GCIB processing systems (100, 100' or 100") described below in FIG. 4, 5 or 6, or any combination thereof.

The substrate comprising the material layer is provided in a reduced-pressure environment in a GCIB processing system. The substrate can be positioned on a substrate holder and may be securely held by the substrate holder. The temperature of the substrate may or may not be controlled. For example, the substrate may be heated or cooled during a film forming process. The environment surrounding the substrate is maintained at a reduced pressure.

A GCIB is generated in the reduced-pressure environment, and can be generated from a pressurized gas mixture. The pressurized gas mixture may use a material source comprising one or more gases containing elements selected from the group consisting of He, Ne, Ar, Kr, Xe, B, C, Si, Ge, N, P, As, O, S, F, and Cl. For example, the material source comprises $SiH_4$, $Si_2H_6$, $SiH_2Cl_2$, $SiCl_3H$, methylsilane, dimethylsilane, trimethylsilane, tetramethylsilane, ethylsilane, diethylsilane, triethylsilane, tetraethylsilane, $SiCl_4$, $SiF_4$, $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $N_2$, $H_2$, $O_2$, NO, $NO_2$, $N_2O$, $NH_3$, $NF_3$, HCl, $SF_6$, CO, $CO_2$, $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_6H_{10}$, $C_6H_6$, $C_6H_{10}$, $C_6H_{12}$, $BF_3$, $B_2H_6$, $AsH_3$, $AsF_5$, $PH_3$, $PF_3$, $PCl_3$, or $PF_5$, or any combination of two or more thereof.

Furthermore, the pressurized gas mixture may comprise an optional inert gas. The optional inert gas may comprise a noble gas.

A beam acceleration potential, a beam dose, and/or a cluster size can be selected. The beam acceleration potential, the beam dose, and/or the cluster size can be selected to achieve pre-specified properties in the one or more material layers. For example, the beam acceleration potential, cluster size, and/or beam dose may be adjusted to alter the material properties of the material layer, i.e., as will be described below, alter a concentration of one or more species within the material layer, a concentration profile of one or more species within the material layer, or depth of one or more species within the material layer, or any combination thereof. The beam acceleration potential may range up to 100 kV, the cluster size may range up to several tens of thousands of atoms, and the beam dose may range up to about $1 \times 10^{16}$ clusters per $cm^2$. For example, the beam acceleration potential may be used to modify the depth of the one or more species in the material layer, i.e., increasing the beam acceleration potential increases the depth and decreasing the beam acceleration potential decreases the depth. Additionally for example, the beam dose may be used to modify the concentration of the one or more species in the material layer, i.e., increasing the beam dose increases the final concentration and decreasing the beam dose decrease the final concentration. The GCIB is accelerated according to the beam acceleration potential, and the substrate is exposed to the GCIB according to the beam dose.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

The inventors have discovered that a range of energy, in particular a range of energy per atom ratio, for the GCIB treatment is optimal for modifying a material layer and for modifying a material layer to adjust a concentration of one or more species present in the material layer. For example, the energy per atom ratio may range from about 0.25 eV per atom to about 100 eV per atom. Alternatively, for example, the energy per atom ratio may range from about 0.25 eV per atom to about 10 eV per atom. Alternatively, for example, the energy per atom ratio may range from about 1 eV per atom to about 10 eV per atom. The energy per atom ratio may be used to adjust the concentration of one or more species present in the material layer and/or the depth to which the one or more species are present in the material layer. For instance, while decreasing the energy per atom ratio, the adjusted depth may be decreased. Alternatively, while increasing the energy per atom ratio, the adjusted depth may be increased.

The establishment of the GCIB having a desired energy per atom ratio may include selection of a beam acceleration potential, a stagnation pressure for formation of the GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, as shown in FIG. 2, an increase in the stagnation pressure during formation of the GCIB causes an increase in the cluster size (i.e., number of atoms per cluster) and, consequently, a decrease in the energy per atom ratio for a given beam acceleration potential.

Figure 2:
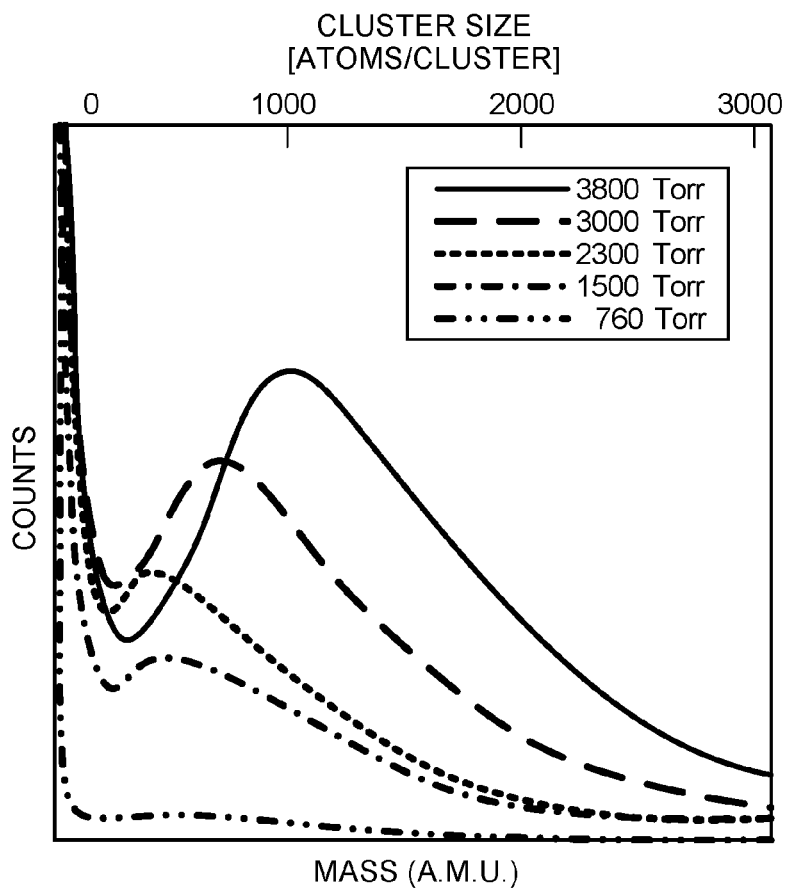
FIG. 2 is a graph that provides exemplary data for forming a GCIB.

Referring to FIG. 2, the distribution of cluster size in a GCIB is provided as a function of the stagnation (total) pressure at the inlet of the nozzle in the GCIB processing system (e.g., nozzle 110 in FIGS. 4 through 6) for a given nozzle design. The cluster size distribution is measured for an Ar GCIB using the time of flight method. Therein, cluster counts are recorded as a function of mass, which correlates with the number of atoms per cluster. As shown in FIG. 2, the peak cluster size in each distribution increases with increasing stagnation pressure.

Additionally yet, other GCIB properties may be varied to adjust the modification of the material layer including, but not limited to, beam energy distribution, cluster size distribution, or gas nozzle design (such as nozzle throat diameter, nozzle length, and/or nozzle divergent section half-angle).

Figure 3A:
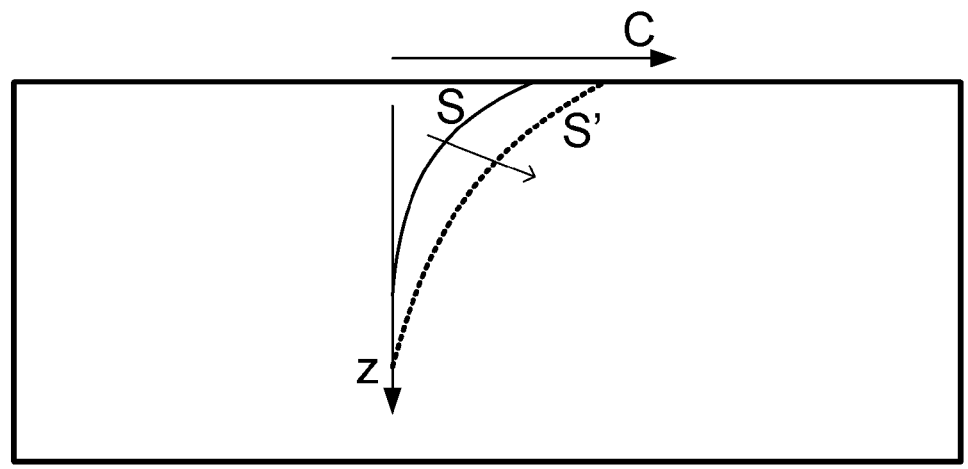
FIGS. 3A through 3B illustrate methods for modifying a material layer according to several embodiments.
Figure 3B:
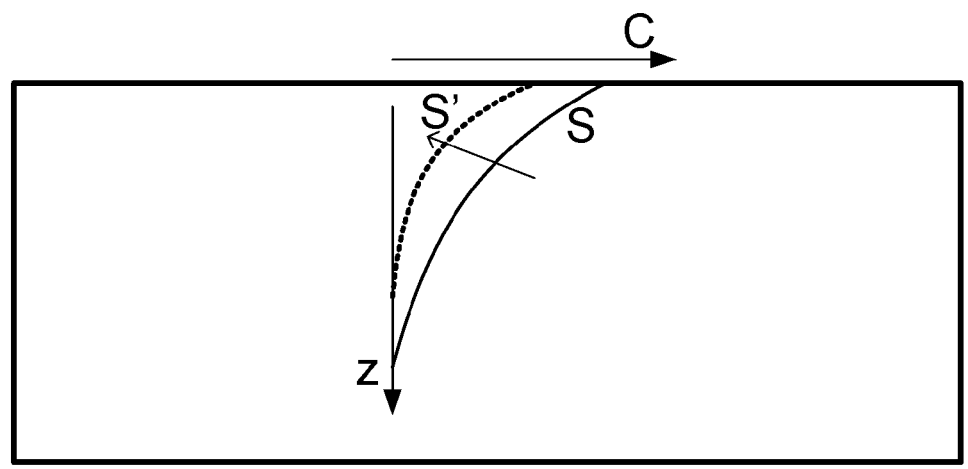

In 30, an initial concentration of a specie present in the material layer is modified to a final concentration by exposing the material layer to the GCIB containing the specie. Herein, modification of a material layer may include adjusting the concentration of an atomic or molecular specie present in the material layer. The concentration of the atomic or molecular specie present in the material layer may be adjusted at one or more sub-layers or regions within the material layer using one or more GCIB treatments. For example, the concentration profile of the atomic or molecular specie present in the material layer may be adjusted using one or more GCIB treatments. In one embodiment, as illustrated in FIG. 3A, a concentration (C) of a specie (S) present at various depths (z) in the material layer is increased (S→S') using one or more GCIB treatments. In another embodiment, as illustrated in FIG. 3B, a concentration (C) of a specie (S) present at various depths (z) in the material layer is decreased using one or more GCIB treatments. In yet another embodiment, a concentration of a first specie present in the material layer is increased and a concentration of a second specie present in the material layer is decreased using the one or more GCIB treatments (e.g., combination of illustrations in FIGS. 3A and 3B for more than one specie to be altered).

In another embodiment, a concentration of a first specie present in the material layer is modified, and a second specie is introduced to the material layer.

According to one example, the initial concentration of the specie in the material layer may be adjusted such that the final concentration of the specie provides a substantially stoichiometric relationship between the specie and the other species in the material layer. According to another example, the oxygen and/or nitrogen content in a silicon-containing and/or metal-containing material layer may be increased. According to yet another example, the oxygen and/or nitrogen content in a silicon-containing and/or metal-containing material layer may be increased, while the fluorine content in the silicon-containing and/or metal-containing material layer may be decreased.

In addition to modifying one or more properties in the material layer, the material layer to be treated may be pre-treated or post-treated. For example, the material layer may be subjected to GCIB treatment, such as irradiation by an inert beam, before or after the modification process described above. Additionally, for example, the material layer may be exposed to an inert GCIB, such as an Ar GCIB, prior to the modification process in order to alter the penetration depth of the ensuing modification process.

Furthermore, the material layer may be annealed following modification of the material layer. The material layer may be annealed via a thermal treatment, wherein the temperature of the material layer is elevated to a material-specific temperature for a period of time. The temperature and the time for the annealing process may be adjusted in order to vary the properties of the material layer. For example, the temperature of the material layer may be elevated to a value greater than about 800 degrees C. Additionally, for example, the temperature of the material layer may be elevated to a value greater than about 850 degrees C. Additionally yet, for example, the temperature of the material layer may be elevated to a value greater than about 900 degrees C. Furthermore, for example, the time for the annealing process may be greater than about 1 millisecond. The annealing process may be performed at atmospheric pressure or reduced pressure. Additionally, the annealing process may be performed with or without an inert gas atmosphere. Furthermore, the annealing process may be performed in a furnace, a rapid thermal annealing (RTP) system, a flash lamp annealing system, or a laser annealing system.

Figure 4:
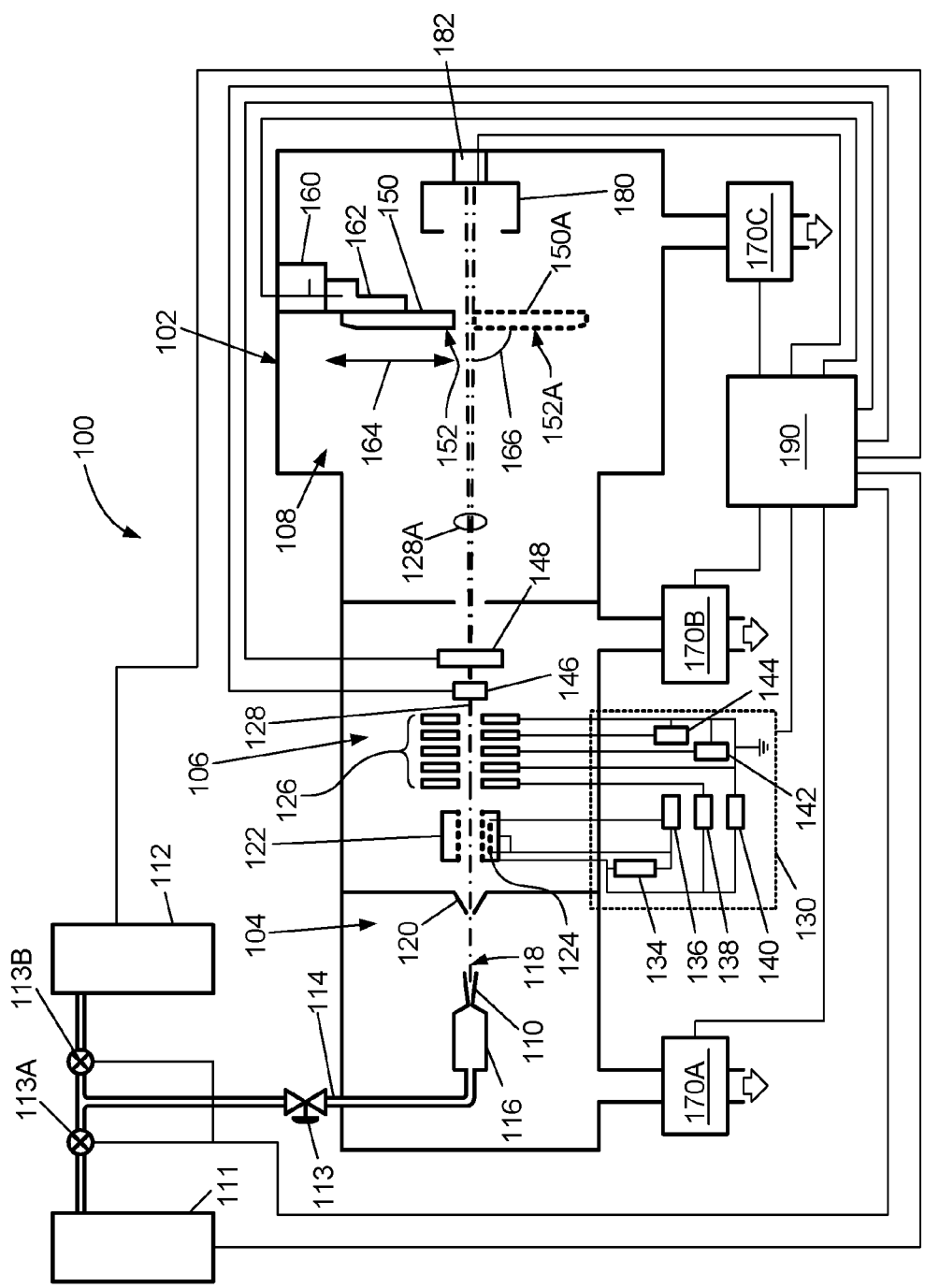
FIG. 4 is an illustration of a GCIB processing system.

Referring now to FIG. 4, a GCIB processing system 100 for modifying the composition of a material layer or structure as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 4, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

As shown in FIG. 4, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to be introduced to the material layer.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 4, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 4, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 4, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{Acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 4, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 4, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 4, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 5:
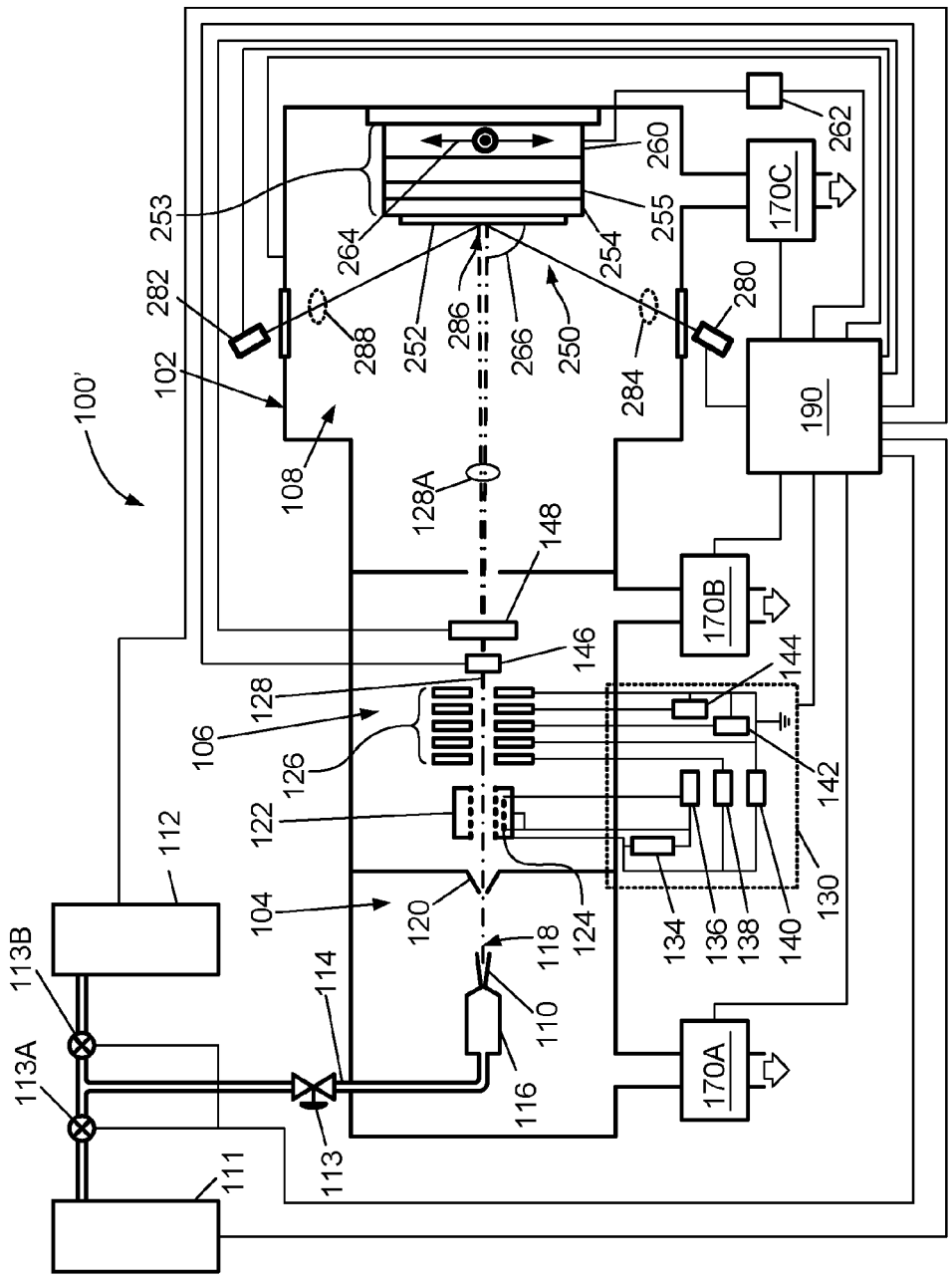
FIG. 5 is another illustration of a GCIB processing system.

In the embodiment shown in FIG. 5, the GCIB processing system 100' can be similar to the embodiment of FIG. 4 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 4) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 6:
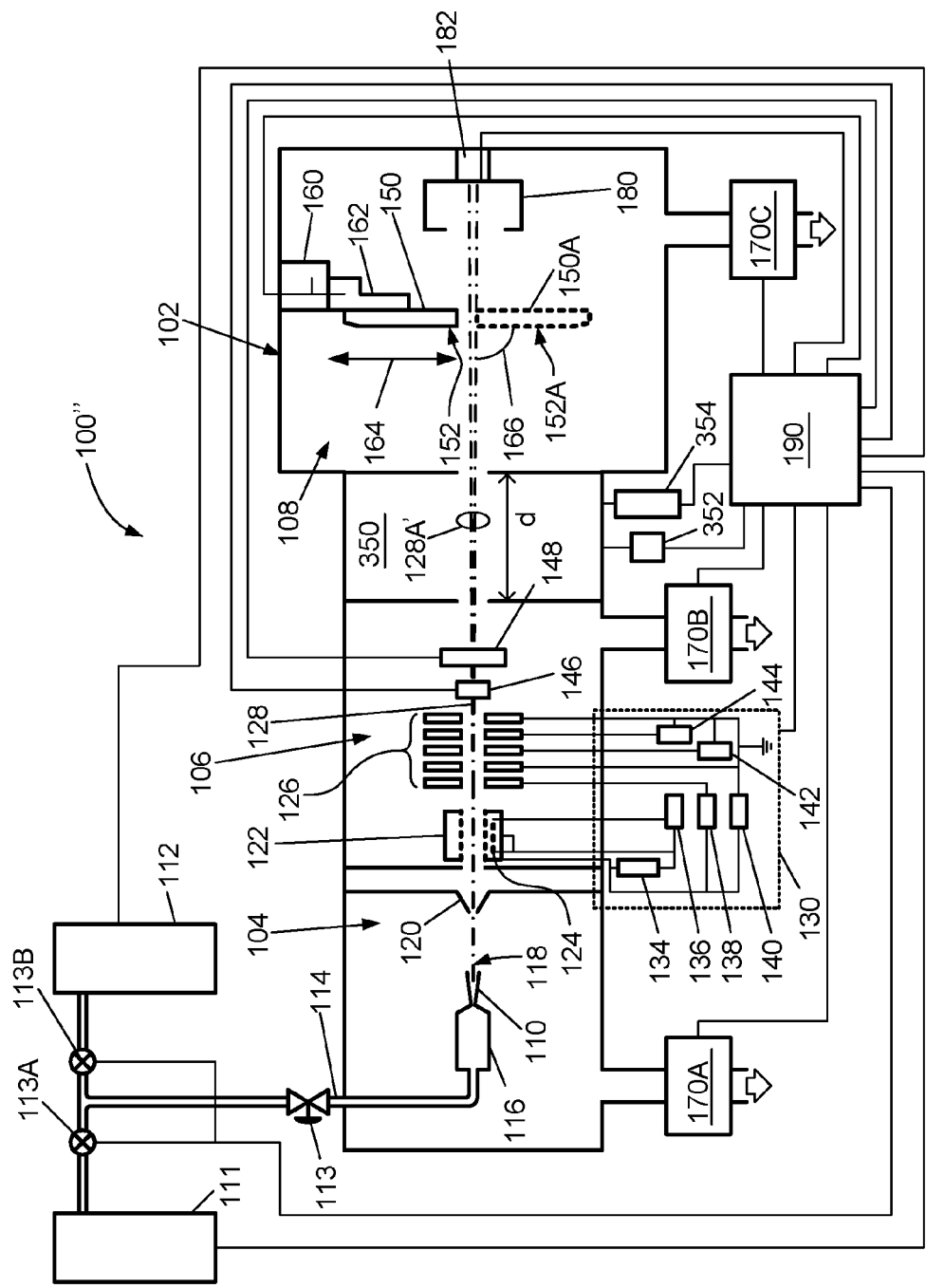
FIG. 6 is yet another illustration of a GCIB processing system.

In the embodiment shown in FIG. 6, the GCIB processing system 100" can be similar to the embodiment of FIG. 4 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the Internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the Internet. Furthermore, another computer (i.e., controller, server, etc.) can access control system 190 to exchange data via a direct connection, an intranet, and/or the Internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 7:
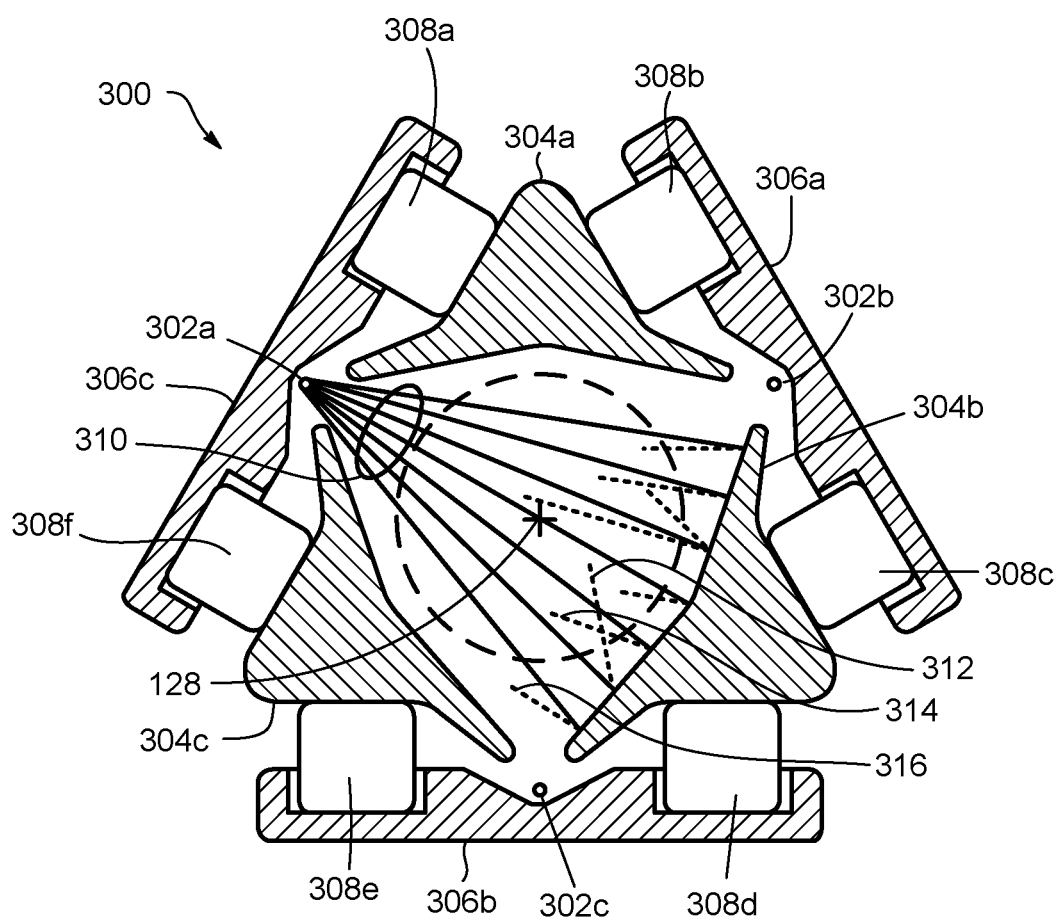
FIG. 7 is an illustration of an ionization source for a GCIB processing system.

Referring now to FIG. 7, a section 300 of a gas cluster ionizer (122, FIGS. 4, 5 and 6) for ionizing a gas cluster jet (gas cluster beam 118, FIGS. 4, 5 and 6) is shown. The section 300 is normal to the axis of GCIB 128. For typical gas cluster sizes (2000 to 15000 atoms), clusters leaving the skimmer aperture (120, FIGS. 4, 5 and 6) and entering an ionizer (122, FIGS. 4, 5 and 6) will travel with a kinetic energy of about 130 to 1000 electron volts (eV). At these low energies, any departure from space charge neutrality within the ionizer 122 will result in a rapid dispersion of the jet with a significant loss of beam current. FIG. 7 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled "Ionizer and method for gas-cluster ion-beam formation"; the content of which is incorporated herein by reference in its entirety.

The gas cluster ionizer (122, FIGS. 4, 5 and 6) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of modifying a material layer on a substrate, comprising:
   providing a substrate having a material layer formed on said substrate, said material layer having an initial concentration of a specie;
   establishing a gas cluster ion beam (GCIB), wherein said GCIB comprises an energy per atom ratio ranging from about 0.25 eV per atom to about 100 eV per atom, and wherein said GCIB is free of said specie; and
   after said establishing, modifying said initial concentration of said specie to a final concentration of said specie by exposing said material layer to said GCIB to remove at least a portion of said specie from said material layer, wherein said final concentration of said specie is less than said initial concentration of said specie.

2. The method of claim 1, wherein said specie comprises an undesirable specie present in said material layer, and wherein said modifying said initial concentration of said specie to said final concentration of said specie comprises removing said undesirable specie from said material layer without removing said material layer.

3. The method of claim 1, wherein:
   said material layer comprises an oxide, and wherein said specie comprises oxygen; or
   said material layer comprises a nitride, and wherein said specie comprises nitrogen; or
   said material layer comprises an oxide and a nitride, and wherein said specie comprises oxygen and nitrogen; or said material layer comprises a carbide, and wherein said specie comprises carbon; or said material layer comprises a carbide and an oxide, and wherein said specie comprises carbon and oxygen; or said material layer comprises a carbide and a nitride, and wherein said specie comprises carbon and nitrogen; or said material layer comprises a carbide, an oxide, and a nitride, and wherein said specie comprises carbon, oxygen, and nitrogen.

4. The method of claim 1, wherein:

said material layer comprises silicon oxide ($SiO_x$), a silicon oxynitride ($SiO_xN_y$), a metal silicate ($MSiO_x$), a metal silicon oxynitride ($MSiO_xN_y$), or a metal oxide ($MO_x$), and wherein said specie comprises oxygen; or said material layer comprises silicon nitride ($SiN_y$), silicon oxynitride ($SiO_xN_y$), boron nitride ($BN_y$), a metal silicon oxynitride ($MSiO_xN_y$), a metal silicon nitride ($MSiN_y$), or a metal nitride ($MN_y$), and wherein said specie comprises nitrogen; or said material layer comprises silicon carbide ($SiC_y$), silicon oxycarbide ($SiO_xC_y$), silicon carbonitride ($SiC_xN_y$), silicon oxycarbonitride ($SiO_xC_yN_z$), a metal carbide ($MC_y$), a metal carbonitride ($MC_xN_y$), or a metal oxycarbonitride ($MO_xC_yN_z$), and wherein said specie comprises carbon.

5. The method of claim 1, wherein said material layer comprises silicon, or a metal, or both.

6. The method of claim 1, further comprising:
adjusting at least one of an optical property, a thermal property, a chemical property, or an electrical property of said material layer during said modifying.

7. The method of claim 1, wherein said material layer comprises said specie and one or more other species.

8. The method of claim 7, wherein said final concentration of said specie provides a substantially stoichiometric relationship between said specie and said other species in said material layer.

9. The method of claim 1, wherein said material layer comprises $HfO_2$, $HfSi_xO_y$, $ZrO_2$, $ZrSi_xO_y$, $TiO_2$, $Ta_2O_5$, a rare earth oxide, mixed rare earth oxide, rare earth nitride, mixed rare earth nitride, rare earth oxynitride, mixed rare earth oxynitride, aluminum oxide, aluminum nitride, rare earth aluminum oxide, mixed rare earth aluminum oxide, rare earth aluminum nitride, mixed rare earth aluminum nitride, rare earth aluminum oxynitride, or mixed rare earth aluminum oxynitride.

10. The method of claim 1, wherein said modifying said initial concentration comprises:
providing said substrate in a reduced-pressure environment;
generating said GCIB in said reduced-pressure environment from a pressurized gas mixture;
selecting a beam acceleration potential and a beam dose to modify said composition of said material layer;
accelerating said GCIB according to said beam acceleration potential; and
irradiating said accelerated GCIB onto at least a portion of said substrate according to said beam dose.

11. The method of claim 10, wherein said pressurized gas mixture comprises He, Ne, Ar, Kr, Xe, a B-containing gas, a C-containing gas, a Si-containing gas, a Ge-containing gas, a N-containing gas, a P-containing gas, an As-containing gas, an O-containing gas, a S-containing gas, a F-containing gas, or a Cl-containing gas, or any combination of two or more thereof.

12. The method of claim 11, wherein said pressurized gas mixture comprises a nitrogen-containing gas and an inert gas, or an oxygen-containing gas and an inert gas, or a combination thereof.

13. The method of claim 12, wherein said pressurized gas mixture comprises a noble gas, $O_2$, $CO_2$, CO, $N_2$, $NH_3$, $NF_3$, NO, $N_2O$, or $NO_2$, or any combination of two or more thereof.

14. The method of claim 1, further comprising:
modifying a depth or a concentration profile or both a depth and concentration profile of said specie in said material layer.

15. The method of claim 1, further comprising:
introducing another specie to said material layer, or
modifying a concentration of said another specie already present in said material layer.

16. The method of claim 15, wherein a final concentration of said another specie already present in said material layer is greater than an initial concentration of said second specie in said material layer following said GCIB exposure.

17. The method of claim 1, further comprising:
annealing said material layer.

18. The method of claim 1, further comprising:
treating said material layer with an inert GCIB.

19. The method of claim 1, further comprising:
performing an etching process prior to performing said modifying.

* * * * *